United States Patent
Sokolov et al.

(10) Patent No.: US 11,150,563 B2
(45) Date of Patent: Oct. 19, 2021

(54) METHOD OF MEASURING A PARAMETER OF A PATTERNING PROCESS, METROLOGY APPARATUS, TARGET

(71) Applicant: ASML NETHERLANDS B.V., Veldhoven (NL)

(72) Inventors: Sergei Sokolov, Utrecht (NL); Sergey Tarabrin, Eindhoven (NL); Su-Ting Cheng, Eindhoven (NL); Armand Eugene Albert Koolen, Nuth (NL); Markus Franciscus Antonius Eurlings, Tilburg (NL); Koenraad Remi André Maria Schreel, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 15 days.

(21) Appl. No.: 16/708,509

(22) Filed: Dec. 10, 2019

(65) Prior Publication Data

US 2020/0192230 A1 Jun. 18, 2020

(30) Foreign Application Priority Data

Dec. 18, 2018 (EP) .................................... 18213270
Mar. 13, 2019 (EP) .................................... 19162436

(51) Int. Cl.
*G03F 7/20* (2006.01)
(52) U.S. Cl.
CPC ...... *G03F 7/70641* (2013.01); *G03F 7/70633* (2013.01)
(58) Field of Classification Search
CPC .. G03F 7/705; G03F 7/70616; G03F 7/70625; G03F 7/70633; G03F 7/70641; G03F 7/70683; G03F 9/70; G03F 9/7007; G03F 9/7011; G03F 9/7092
USPC .................. 355/55, 67, 68, 77; 356/399–401
See application file for complete search history.

(56) References Cited

U.S. PATENT DOCUMENTS

| 9,977,344 B2 | 5/2018 | Tel et al. |
| 2004/0033426 A1* | 2/2004 | Den Boef ............. G03F 9/7049 430/22 |
| 2011/0027704 A1 | 2/2011 | Cramer et al. |
| 2011/0043791 A1 | 2/2011 | Smilde et al. |

(Continued)

FOREIGN PATENT DOCUMENTS

| JP | 2003302356 | 10/2003 |
| WO | 2004061371 | 2/2004 |

(Continued)

OTHER PUBLICATIONS

Taiwanese Office Action issued in corresponding Taiwanese Patent Application No. 108145221, dated Jun. 30, 2020.

(Continued)

*Primary Examiner* — Colin W Kreutzer
(74) *Attorney, Agent, or Firm* — Pillsbury Winthrop Shaw Pittman LLP

(57) ABSTRACT

A technique of measuring a parameter of a patterning process is disclosed. In one arrangement, a target, formed by the patterning process, is illuminated. A sub-order diffraction component of radiation scattered from the target is detected and used to determine the parameter of the patterning process.

21 Claims, 10 Drawing Sheets

(56) References Cited

U.S. PATENT DOCUMENTS

2012/0242970 A1   9/2012   Smilde et al.

FOREIGN PATENT DOCUMENTS

| WO | 2009078708 | 6/2009 |
| WO | 2009106279 | 9/2009 |

OTHER PUBLICATIONS

Extended European Search Report and Written Opinion issued in corresponding European Patent Application No. 18213270.4, dated Jun. 3, 2019.
International Search Report and Written Opinion issued in corresponding PCT Patent Application No. PCT/EP2019/081887, dated Jan. 7, 2020.

* cited by examiner

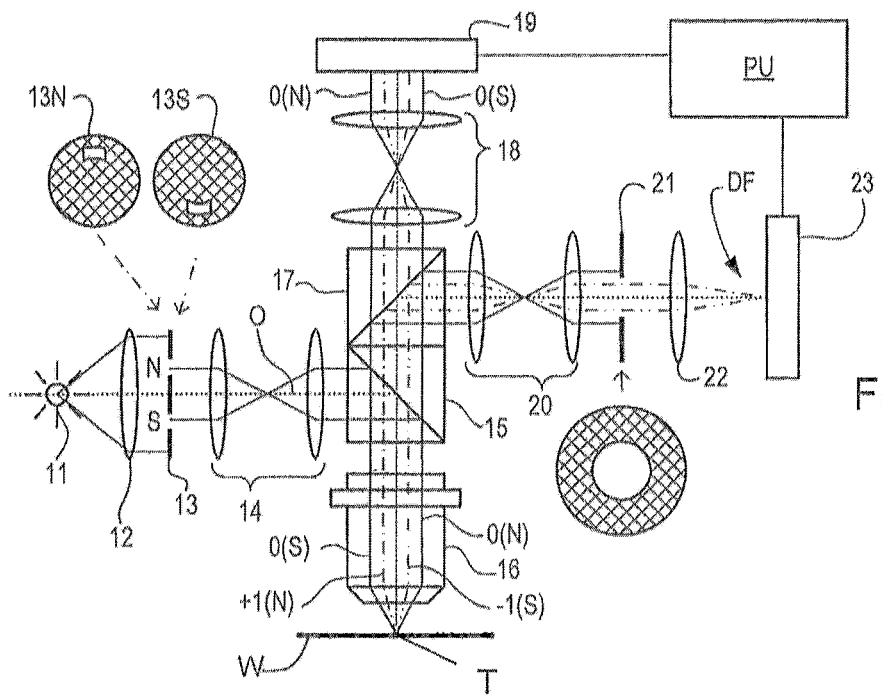
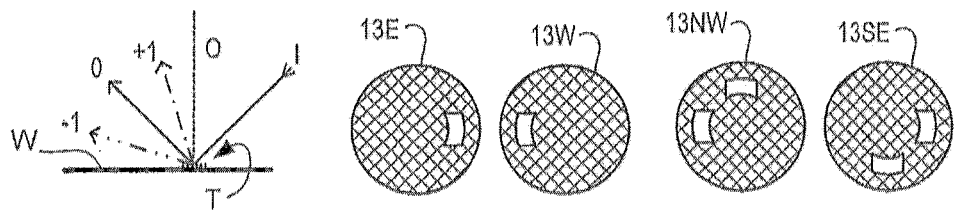
Fig. 3A  Fig. 3B  Fig. 3C  Fig. 3D
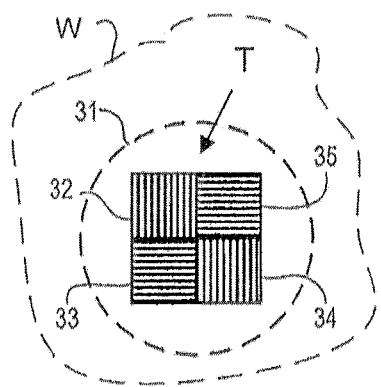
Fig. 4
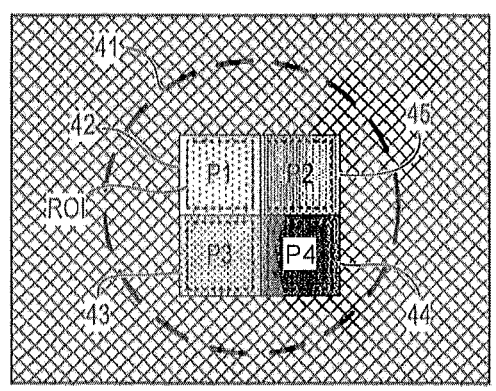
Fig. 5

METHOD OF MEASURING A PARAMETER OF A PATTERNING PROCESS, METROLOGY APPARATUS, TARGET

This application is based upon and claims the benefit of priority of European patent application no. 19162436.0, filed on Mar. 13, 2019, and European patent application no. 18213270.4, filed Dec. 18, 2018. The entire contents of each of the foregoing applications is incorporated herein in its entirety by reference.

FIELD

The present description relates to measuring a parameter of a patterning process, such as overlay or focus.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, and etching of the pattern by an etch apparatus. Further, one or more metrology processes are involved in the patterning process.

Metrology processes may be used to monitor and/or control the patterning process. Various tools are available for performing metrology processes, including various forms of scatterometer. These devices direct a beam of radiation onto a metrology target and measure one or more properties of the scattered radiation. The one or more properties of the scattered radiation may yield information about parameters which contribute to asymmetry in the scattered radiation, such as errors in alignment between different layers (overlay) and focus errors.

SUMMARY

To minimize space taken up by structures on the substrate that are exclusively used as metrology targets, it is desirable to use relatively small metrology targets or even to use portions of structures intended to form part of a final product being manufactured as metrology targets. Using metrology targets having similar dimensions to product structures may also provide a better representation of product structures and improve metrology. However, reducing the size of metrology targets leads to a corresponding reduction in the pitch of structures in the metrology targets. When the pitch becomes significantly shorter than the illumination wavelength used for metrology, all diffraction orders above the zeroth order may become evanescent, which interferes with traditional ways of obtaining information about the metrology targets from the scattered radiation.

In some metrology arrangements, particularly where illumination of the target is highly coherent, unwanted interference effects such as fringes can be introduced into images of the target. The interference effects may disrupt determination of a parameter of the patterning process using the images.

According to an aspect, there is provided a method of measuring a parameter of a patterning process, comprising: illuminating a target formed by the patterning process; detecting a sub-order diffraction component of radiation scattered from the target; and using the detected sub-order diffraction component to determine the parameter of the patterning process.

According to an aspect, there is provided a metrology apparatus for measuring a parameter of a patterning process, comprising: an optical system configured to illuminate a target with radiation and direct radiation scattered from the target to a detector, wherein the optical system and detector are configured to detect a sub-order diffraction component of radiation scattered from the target.

According to an aspect, there is provided a target for use in a method of determining a parameter of a patterning process, wherein: the target comprises a multilayer structure having a periodic structure formed in two or more layers of the multilayer structure; and a wavelength of a principal periodicity of the periodic structure is between 50 nm and 400 nm.

BRIEF DESCRIPTION OF THE DRAWINGS

Embodiments will now be described, by way of example only, with reference to the accompanying drawings in which:

FIG. 3A is a schematic diagram of a measurement apparatus for use in measuring targets using a first pair of illumination apertures providing selected illumination modes;

FIG. 3B is a schematic detail of a diffraction spectrum of a target for a given direction of illumination;

FIG. 3C is a schematic illustration of a second pair of illumination apertures providing further illumination modes for use in diffraction-based overlay measurements;

FIG. 3D is a schematic illustration of a third pair of illumination apertures combining the first and second pairs of apertures;

FIG. 4 schematically depicts a form of multiple periodic structure (e.g., multiple grating) target and an outline of a measurement spot on a substrate;

FIG. 5 schematically depicts an image of the target of FIG. 4 obtained in the apparatus of FIG. 3;

DETAILED DESCRIPTION

Before describing embodiments in detail, it is instructive to present an example environment in which embodiments may be implemented.

Figure 1:
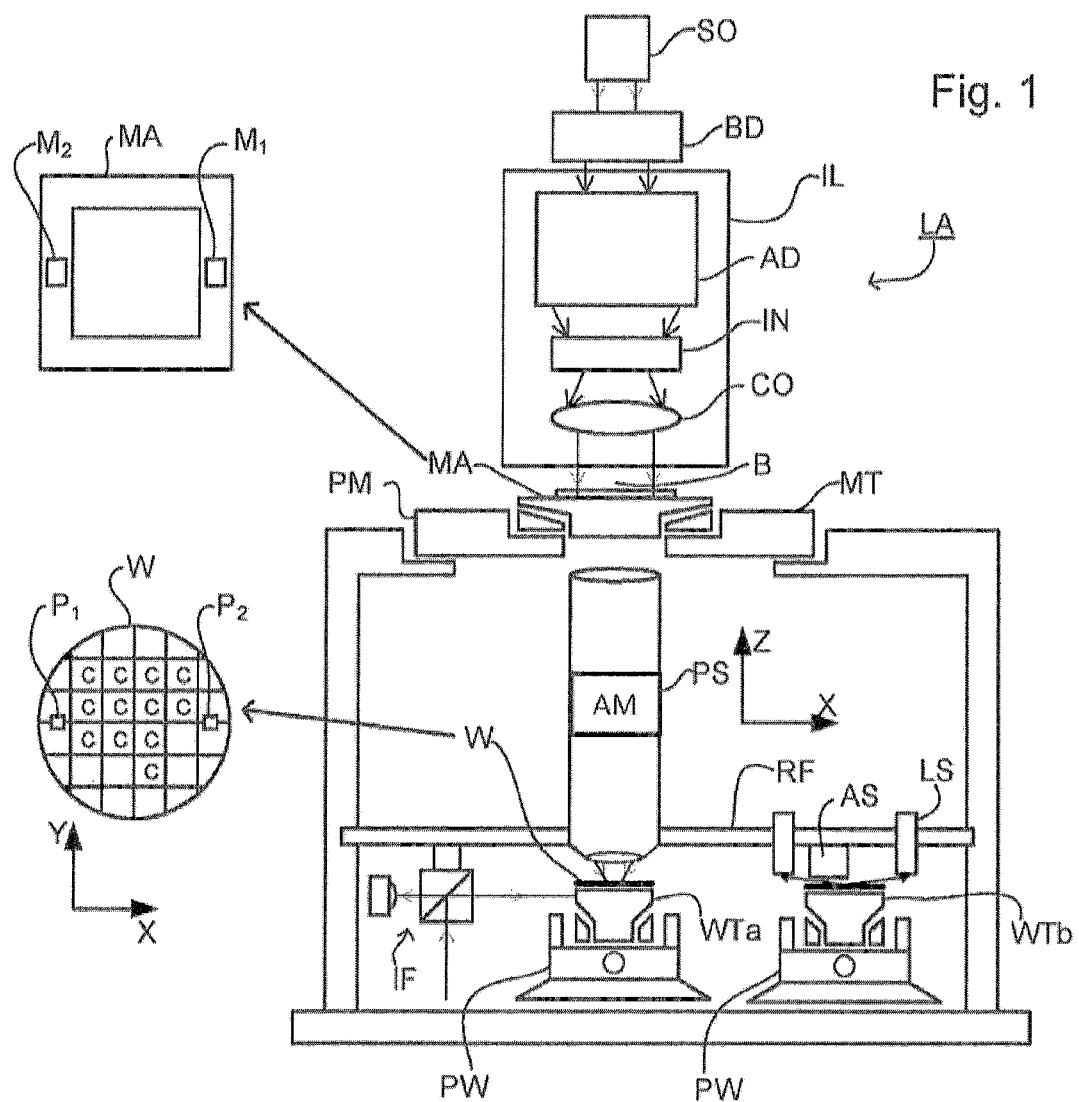
FIG. 1 schematically depicts an example lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two-dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
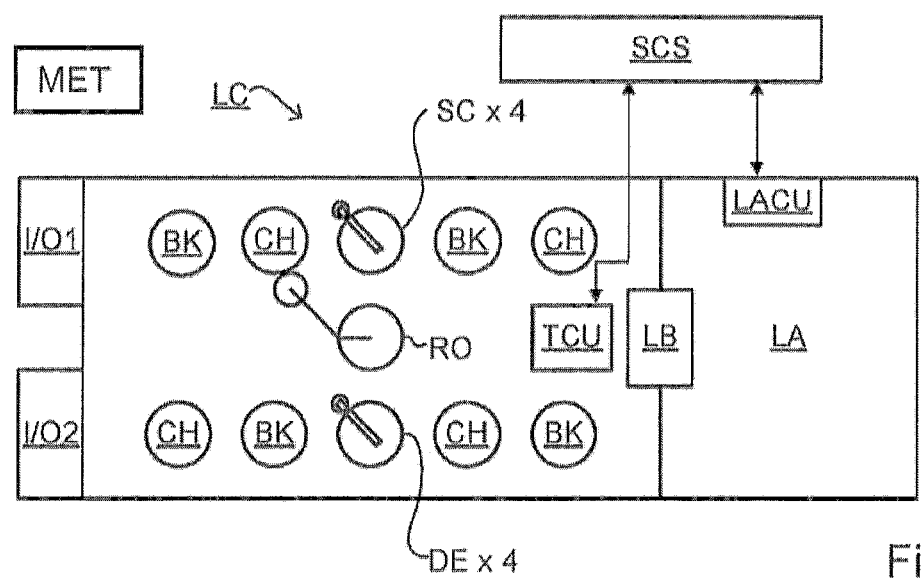
FIG. 2 schematically depicts an example lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure or determine one or more properties such as overlay (which can be, for example, between structures in overlying layers or between structures in a same layer that have been provided separately to the layer by, for example, a double patterning process), line thickness, critical dimension (CD), focus offset, or a material property. Accordingly, a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary, or different layers of the same substrate vary from layer to layer. The metrology apparatus may be integrated into the lithographic apparatus LA or the lithocell LC or may be a stand-alone device. To enable rapid measurement, it is desirable that the metrology apparatus measure one or more properties in the exposed resist layer immediately after the exposure. However, the latent image in the resist has a low contrast—there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT) or a Bit Line Contact (BLC) structure).

In an embodiment, the target on a substrate may comprise one or more 1-D periodic structures (e.g., gratings), which are printed such that after development the periodic structural features are formed of solid resist lines. In an embodiment, the target may comprise one or more 2-D periodic structures (e.g., gratings), which are printed such that after development the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entireties by reference. Further developments of the technique have been described in U.S. patent application publications US2011-0027704, US2011-0043791 and US2012-0242970, which are hereby incorporated in their entireties by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

A metrology apparatus suitable for use in embodiments to measure, e.g., overlay is schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access to an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, two example aperture plates 13 are shown, labeled 13N and 13S, which respectively allow different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. For example, an alternative aperture plate may be provided in which radiation is blocked in two opposite quadrants and allowed to pass in the other two opposite quadrants, thereby providing the illumination mode 60 depicted in FIG. 6 referred to below. The rest of the pupil plane is desirably dark as any unnecessary radiation outside the desired illumination mode may interfere with the desired measurement signals.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. Each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the 'north' side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the target is used, and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (i.e., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU process these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
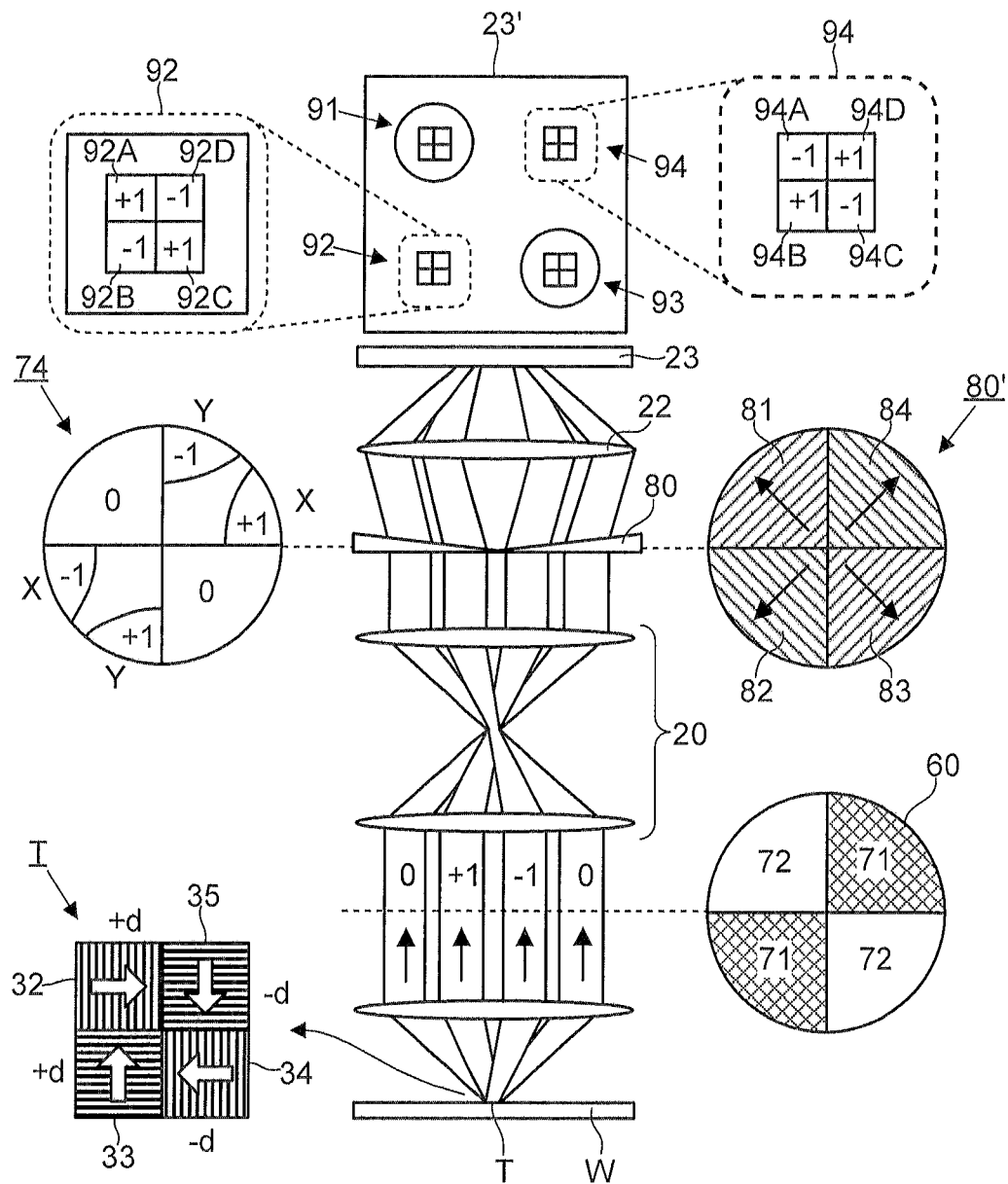
FIG. 6 schematically depicts an optical system of a metrology apparatus using an illumination mode in which incident radiation is blocked from two diametrically opposite quadrants in the pupil plane.

FIG. 6 depicts an alternative configuration having the second measurement branch of FIG. 3A and in which an alternative aperture plate is provided instead of aperture plate 13N or 13S in the illumination path. The alternative aperture plate may be provided at the position of the aperture plate 13N or 13S shown in FIG. 3A. The illumination branch is not shown in detail in FIG. 6 to avoid repetition but could be configured as shown in FIG. 3A or any other configuration providing optical functions compatible with the embodiments described below. The first measurement branch may or may not be present. The alternative aperture plate defines an illumination mode as depicted schematically in the lower right-hand part of FIG. 6 and labelled 60. The illumination mode is such that radiation is not incident on the target T from two diametrically opposite quadrants 71 in the pupil plane and radiation is incident on the target T from the other two diametrically opposite quadrants 72 in the pupil plane. In combination with the target T comprising the four periodic structures 32-35, this illumination mode results in separation of the zeroth, +1 and −1 diffracted rays in the pupil plane as indicated by the axial view of the pupil plane radiation distribution labelled 74 in FIG. 6. The positions of the +1 and −1 orders of the periodic structures 32 and 34, which are periodic in the X direction, are labelled X in the distribution 74. The positions of the +1 and −1 orders of the periodic structures 33 and 35, which are periodic in the Y direction, are labelled Y in the distribution 74. The zeroth order radiation for all of the periodic structures 32-35 remains in the quadrants labelled "0" in distribution 74.

A group 80 of wedge-shaped optical elements 81-84 is provided in the pupil plane instead of the aperture stop 21. An axial view of the group 80 of wedge-shaped optical elements is labelled 80'. The group 80 of wedge-shaped optical elements in this example comprises four wedge-shaped optical elements 81-84. Each wedge-shaped optical element fills a quadrant of a circular region in the pupil plane when viewed along an optical axis of the optical system. Each wedge-shaped optical element 81-84 has a lower planar surface and an upper planar surface and is formed from an optical material having a refractive index different from 1. The lower planar surface is aligned obliquely with respect to the upper planar surface (in the manner of a wedge). In the example shown, a maximum gradient of each wedge-shaped optical element 81-84 is aligned along a radial direction, as indicated by the radial arrows in the axial view 80' of FIG. 6. Each wedge-shaped optical element 81-84 has a linear thickness change from the optical axis to the radially outermost edge of the wedge-shaped optical element 81-84. Each of the wedge-shaped optical elements 81-84 receives radiation in a different respective one of the quadrants of the pupil plane radiation distribution 74 and redirects the radiation so that an image of the target T is formed on the sensor 23 in a different location on the sensor 23. An axial view of the sensor 23 is labelled 23' in FIG. 6 and shows example positioning of images 91-94 formed respectively from radiation passing through wedge-shaped elements 81-84. As mentioned above, the term "image" is used here in a broad sense. The image may not comprise all details of the target T (e.g. grating lines) if some of the relevant diffraction orders are not present. In this example, images 91 and 93 correspond to images of the target T formed from zeroth order radiation only. Image 92 comprises a sub-image 92A formed from +1 diffracted rays from periodic structure 32, a sub-image 92B corresponding to −1 diffracted rays from periodic structure 33, a sub-image 92C corresponding to +1 diffracted rays from periodic structure 34, and a sub-image 92D corresponding to −1 diffracted rays from periodic structure 35. Image 94 comprises a sub-image 94A formed from −1 diffracted rays from periodic structure 32, a sub-image 94B corresponding to +1 diffracted rays from periodic structure 33, a sub-image 94C corresponding to −1 diffracted rays from periodic structure 34, and a sub-image 94D corresponding to +1 diffracted rays from periodic structure 35.

The arrangement of FIG. 6 allows simultaneous individual measurement of images of multiple periodic structures 32-35 in a target T formed from different diffraction components (e.g. −1 diffracted rays, +1 diffracted rays, and zeroth order rays).

As mentioned in the introductory part of the description, when the pitch of features in targets T (e.g. grating pitch) becomes significantly shorter than the illumination wavelength used for metrology, diffraction components such as the +1 and −1 orders can become evanescent or occur at angles which cannot be captured practically. Without adaptation, methods which rely on comparing the +1 and −1 orders to detect asymmetry, such as the methods discussed above with reference to FIGS. 3-6, are no longer applicable. An alternative approach is to detect asymmetry in the pupil plane of zeroth order (specular) scattered radiation, but this asymmetry signal is typically weak. A further alternative approach is to detect asymmetry of images of the target, in so called image-based overlay, but the images are expected to disappear when the pitch of features in the target T becomes significantly shorter than the illumination wavelength, due to loss of principal diffraction orders contributing to spatial structure in the image.

Embodiments described below address the above challenges by exploiting the existence of sub-order diffraction components in radiation scattered from the target T. Some of these embodiments use methodologies nominally configured to measure +1 and −1 orders (such as the methods discussed above with reference to FIGS. 3-6) in situations where the +1 and −1 orders are evanescent or not captured. Other embodiments implement image based overlay where the +1 and −1 orders are evanescent or not captured. Still other embodiments provide signal enhancement to methodologies based on detecting asymmetry in the pupil plane.

Figure 7:
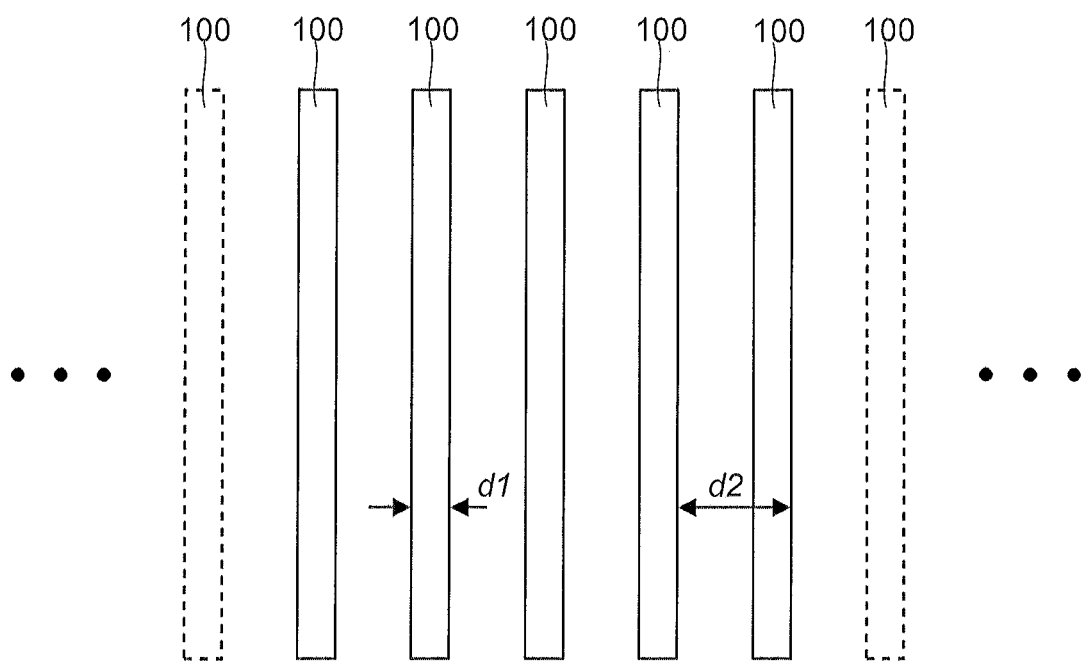
FIG. 7 schematically depicts an infinite grating having grating lines extending perpendicularly to an X direction.
Figure 8:
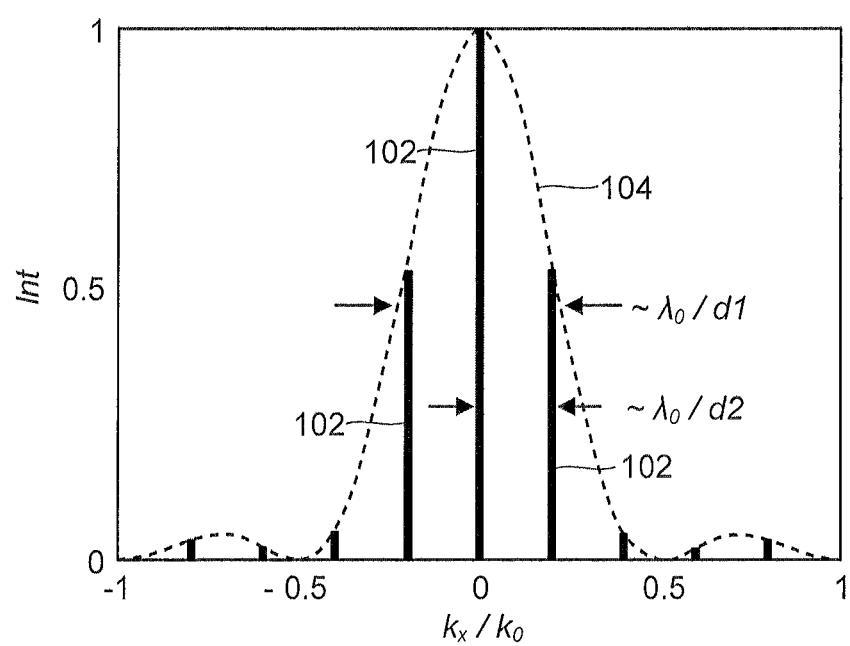
FIG. 8 schematically depicts a diffraction spectrum from the grating of FIG. 7.

Diffraction of light from any finite aperture causes an angular spread of light. FIG. 7 schematically depicts an infinite grating having grating lines 100 extending perpendicularly to an X direction. The width of each grating line 100 is d1. The pitch of the grating is d2. For an infinite grating such as that depicted, which is a good approximation for targets which are large relative to a beam spot, the diffraction spectrum is a comb-like form of infinitely narrow peaks 102, as depicted schematically in FIG. 8 for the grating of FIG. 7. FIG. 8 is a plot of normalized intensity, Int, of diffracted light versus the normalized k-vector of scattered light parallel to the X direction. The separation of the peaks 102 is defined by the ratio of wavelength to pitch, $\lambda_0/d2$. The width of a central peak of an intensity envelope 104 is of the order of the ratio of wavelength to the width d1 of each grating line 100, $\lambda_0/d1$.

Figure 9:
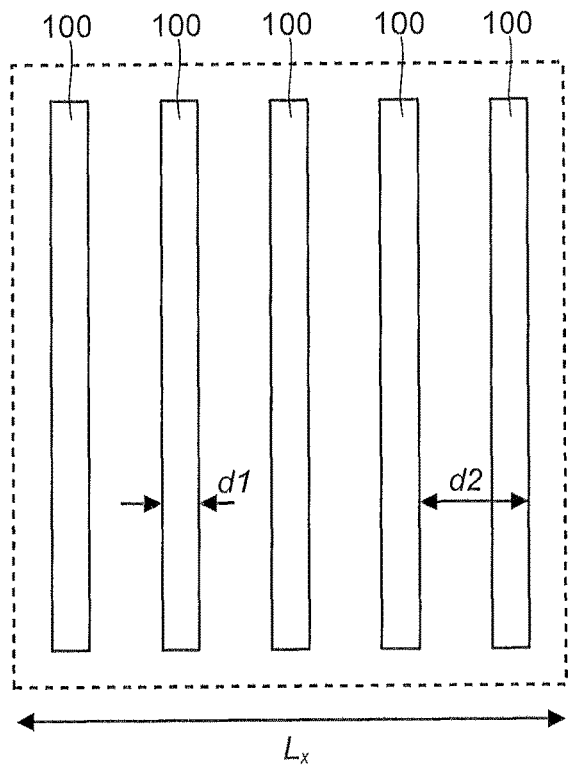
FIG. 9 schematically depicts a finite grating having grating lines extending perpendicularly to an X direction.
Figure 10:
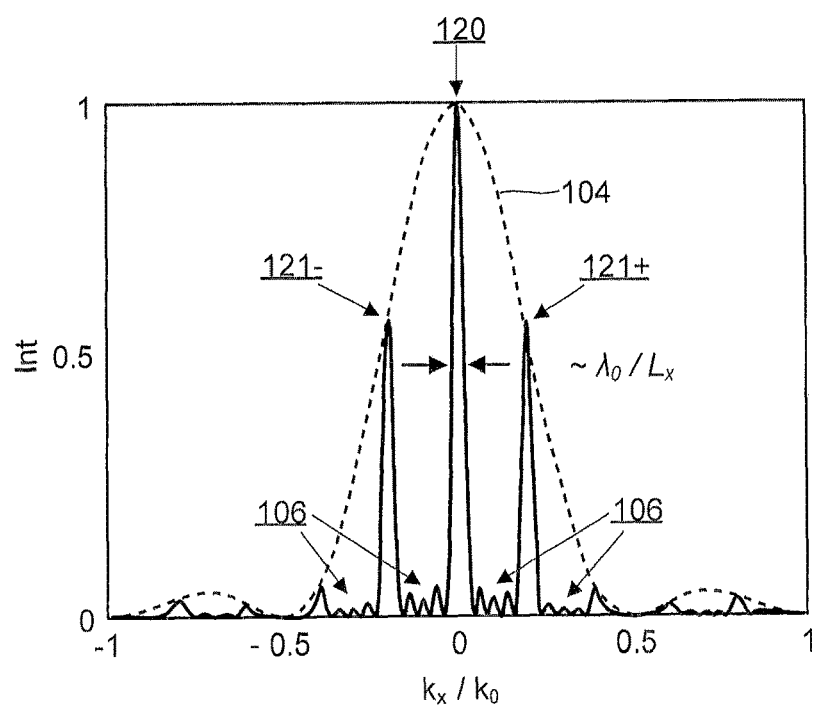
FIG. 10 schematically depicts a diffraction spectrum from the grating of FIG. 9.

FIGS. 9 and 10 correspond to FIGS. 7 and 8 respectively, except that the grating of FIG. 9 is a finite grating having width $L_x$ instead of being an infinite grating. In a finite grating each diffraction order is spread out along the wavenumber axis rather than being infinitely narrow. A width of each diffraction order is of the order of the ratio of the wavelength to the width of the grating, $\lambda_0/L_x$. Additionally, sub-order diffraction components 106 appear between the principal diffraction orders. These sub-order diffraction components contain information about asymmetry in the target T and can be captured even when the principal diffraction orders (e.g. the +1 and −1 diffraction orders) are evanescent or not captured.

The principal first order peak 121− to the left of the principal zeroth order peak 120 is considered to be the principal −1 first order peak 121−. Accordingly, the principal first order peak 121+ to the right of the principal zeroth order peak 120 is the principal +1 first order peak 121+. The difference in intensity of the sub-order diffraction components between the principal zeroth order peak 120 and the principal −1 first order peak 121− compared with the sub-order diffraction components between the principal zeroth order peak 120 and the principal +1 first order peak 121+ is sensitive to asymmetry in the target (e.g. due to overlay, asymmetry in sidewall angles, or focus error effects). The sub-order diffraction components can be thought of as a sum of tails from the principal diffraction order peaks generated due to the broadening of those peaks by the finite size of the target T. Tails originating from the principal zeroth order peak 120 are symmetric on each side of the principal zeroth order peak 120 even where there is asymmetry in the target T. However, the tail originating from the principal +1 order peak will be different from the tail originating from the principal −1 order peak where there is asymmetry in the target T. This is because the principal +1 and −1 order peaks 121+ and 121− are sensitive to asymmetry in the target T. Therefore, in the orientation of FIG. 10, when the right tail of the principal zeroth order peak 120 overlaps with the left tail of the principal +1 first order peak 121+, the resulting sum (defining the sub-diffractions orders 106 in this region) has a different form to the sum resulting from the overlap between the left tail of the principal zeroth order peak 120 and the right tail of the principal −1 first order peak 121−.

Figure 11:
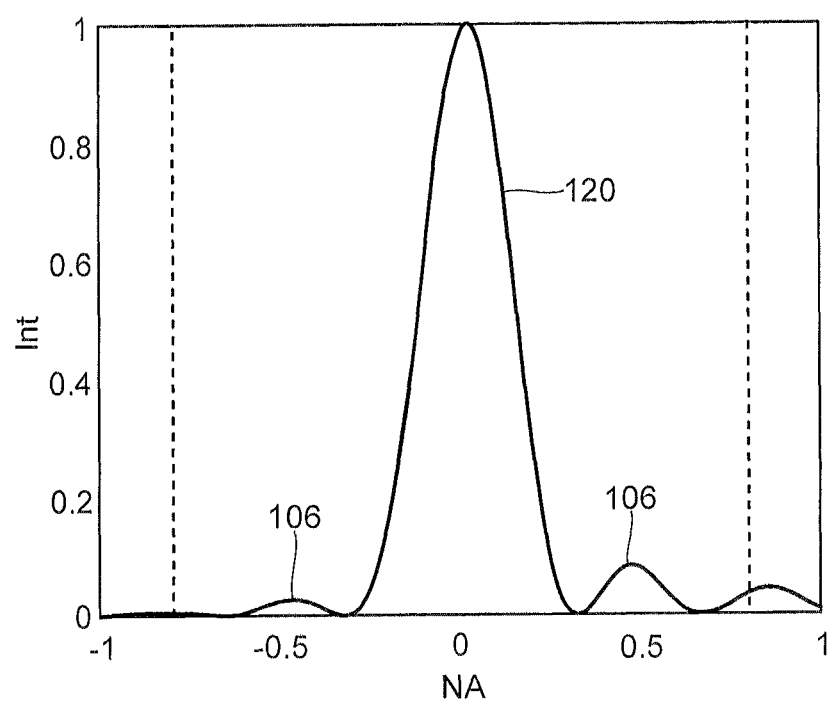
FIG. 11 depicts a simulated diffraction spectrum obtained from a target T having an asymmetric structure.

FIG. 11 depicts a simulated diffraction spectrum for a single angle of incidence obtained from a target T having an asymmetric structure. The ratio of the wavelength of the illuminating radiation to the pitch of a grating in the target was five, such that the only principal diffraction order falling within the range of angles (defined relative to the Normalized Angle, NA) captured by the metrology apparatus (the outer limits of which are indicated by the vertical broken lines) is the principal zeroth order peak 120. Neither the principal −1 first order peak 121− nor the principal +1 first order peak 121+ was captured. However, due to the finiteness of the grating in the target (the target contained 10 lines), the accompanying sub-order diffraction components (tails) 106 also fall within the numerical aperture limits of the metrology apparatus. As described above, the sub-order diffraction components are formed from tails from both the principal zeroth order peak 120 and the principal +1 and −1 first order peaks (falling outside of the numerical aperture). It is impossible to distinguish tails of the principal zeroth order peak from tails of the first order peaks because they are combined as a coherent sum to provide the sub-order diffraction components 106. It can be recognized in FIG. 11 that the amplitude (height) of the sub-order diffraction component 106 on the right of the principal zeroth order peak 120 is different from the amplitude (height) of the sub-order diffraction component 106 on the left of the principal zeroth order peak 120. This is caused by the difference in the contribution to the respective sub-order diffraction components from the (non-captured) principal first order peaks and can be used for measuring asymmetry in the target.

Based on the above principles, a method of measuring a parameter of a patterning process is provided. The method comprises illuminating a periodic structure in a target T. In an embodiment, the periodic structure comprises a grating. The target T may, for example, take any of the forms described above with reference to FIGS. 4-6 for example. The target T is a target T formed by the patterning process. The patterning process may comprise a lithographic process performed using a lithographic apparatus, as described above with reference to FIG. 1. A sub-order diffraction component of radiation scattered from the periodic structure is detected. As described above, sub-order diffraction components are sensitive to asymmetry in the periodic structure. The method uses the detected sub-order diffraction components to determine the parameter of the patterning process.

The parameter of the patterning process may be any parameter to which the sub-order diffraction components are sensitive. Typically, a parameter that contributes to a change in the symmetry of the target (e.g. introducing or increasing an asymmetry) may be measured. For example, the parameter may comprise an error in overlay between different layers of the target, an error in side-wall angle in the target, or an error in focus during a lithographic imaging process.

In an embodiment, the sub-order diffraction component used in the method is formed predominantly from radiation corresponding to a portion of a theoretical diffraction pattern from the periodic structure in the target T that is between and outside of principal first order peaks 121− and 121+ and outside of a principal zeroth order peak 120 (as depicted in FIG. 10).

In an embodiment, the periodic structure comprises a principal periodicity equal to a size of a repeating unit cell in a direction of periodicity of the periodic structure (e.g. a pitch in the X direction for an X-direction periodic structure such as grating with lines extending along the Y direction). The principal zeroth order peak and the principal first order peaks are principal peaks of the theoretical diffraction pattern corresponding to the principal periodicity. The principal zeroth order peak extends from a maximum of the principal zeroth order peak to minima of the principal zeroth order peak (consisting of the first minimum encountered on each side of the maximum of the principal zeroth order peak). Each principal first order peak extends from a maximum of the principal first order peak to minima of the principal first order peak (consisting for each principal first order peak of the first minimum encountered on each side of the maximum of that principal zeroth order peak).

In an embodiment, the periodic structure comprises a diffraction grating having a finite number of grating lines such that a theoretical diffraction pattern from the grating comprises a plurality of principal peaks located at the same positions as principal peaks in a theoretical diffraction pattern from a diffraction grating with the same periodicity and an infinite number of grating lines. The sub-order diffraction component of radiation is formed from radiation defined by structure in the theoretical diffraction pattern outside of the principal peaks.

Embodiments that exploit the sub-order diffraction components are particularly applicable to the case where the illumination used in the metrology method and the periodic structure are such that radiation corresponding to principal first order peaks of the theoretical diffraction pattern from the periodic structure either falls outside of a numerical aperture of an optical system between the target and a detector or is evanescent. The methods are particularly applicable to targets in which a pitch of a principal periodicity of the periodic structure is between 50 nm and 400 nm, optionally between 50 nm and 300 nm, optionally between 50 nm and 200 nm, optionally between 100 nm and 400 nm, optionally between 200 and 400 nm.

In one class of embodiments, the detecting of the sub-order diffraction component comprises separating radiation corresponding to the sub-order diffraction component from radiation corresponding to the principal zeroth order peak 120. This is advantageous because the zeroth order radiation may otherwise dominate the sub-order diffraction components and interfere with extracting useful information from asymmetries in the sub-order diffraction components.

In an embodiment, the separation comprises directing the radiation corresponding to the principal zeroth order peak and the radiation corresponding to the sub-order diffraction component through separate respective regions in a pupil plane of an optical system between the target T and a detector 23. This approach may be implemented for example using either of the two methodologies and metrology apparatus configurations described above with reference to FIGS. 3-5 and FIG. 6 respectively. In each of these two approaches, the +1 and −1 diffraction orders are separated from the zeroth order radiation in a pupil plane before reaching the detector 23.

In an embodiment using the configuration of FIG. 3A, the aperture stop 21 blocks the zeroth order and prevents the zeroth order from contributing to the image formed on the detector 23. In a case where the +1 and −1 orders are evanescent but the sub-order diffraction components are within the numerical aperture of the metrology apparatus (as depicted in FIG. 11 for example), the image formed on the detector 23 will be formed solely form the sub-order diffraction components. By changing, for example, the illumination settings (e.g. swapping the aperture plate 12N for the aperture plate 12S), it is possible to compare an image formed from a sub-order diffraction component 106 on one side of the principal zeroth order peak 120 with an image formed from a sub-order diffraction component 106 on the other side of the principal zeroth order peak 120.

In an embodiment using the configuration of FIG. 6, asymmetries between sub-order diffraction components may be obtained in the same way as the asymmetries between the +1 and −1 diffraction are obtained. In effect, every +1 component indicated in FIG. 6 is replaced with a corresponding sub-order diffraction component from the region of the diffraction pattern between the principal +1 first order peak 121+ and the principal zeroth order peak 120, and every −1 component indicated in FIG. 6 is replaced with a corresponding sub-order diffraction component 106 from the region of the diffraction pattern between the principal −1 first order peak 121- and the principal zeroth order peak 120.

Figure 12:
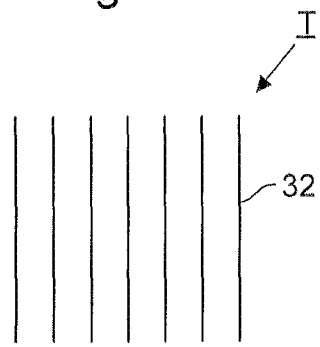
FIG. 12 depicts a target comprising an X-direction periodic structure.
Figure 13:
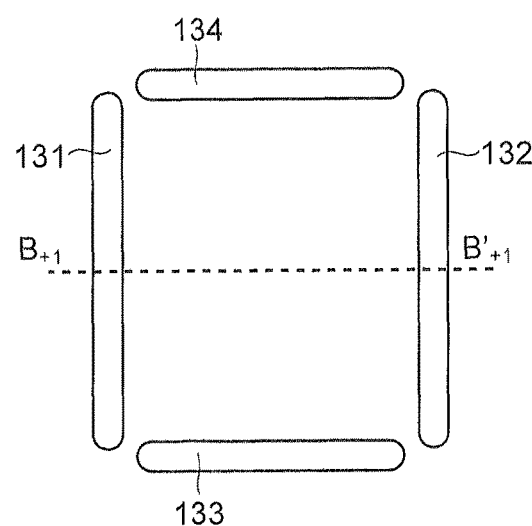
FIGS. 13 and 14 schematically depict images of the target T of FIG. 12 formed using sub-order diffraction components.
Figure 14:
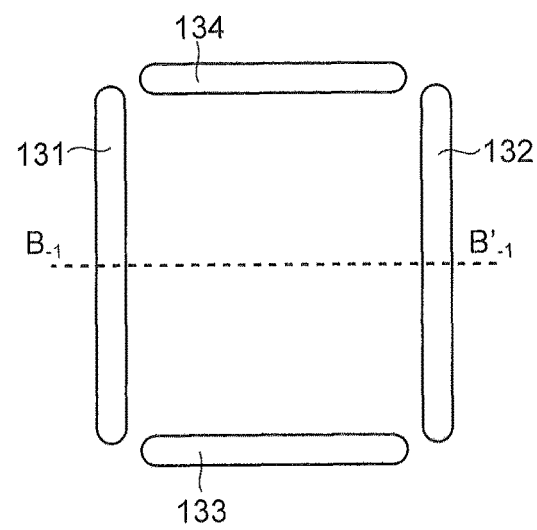

The approach is depicted schematically in FIGS. 12-16. FIG. 12 depicts a target T comprising an X-direction periodic structure 32. The periodic structure 32 has an exemplary pitch of 200 nm and is illuminated with 650 nm radiation to yield a diffraction spectrum having a form of the type depicted in FIG. 11 and discussed above. FIGS. 13 and 14 schematically depict images of the target T formed using the sub-order diffraction components. The image shown in FIG. 13 is formed from sub-order diffraction components 106 from the region of the diffraction pattern between the principal +1 first order peak 121+ and the principal zeroth order peak 120. The image shown in FIG. 14 is formed from sub-order diffraction components 106 from the region of the diffraction pattern between the principal −1 first order peak 121- and the principal zeroth order peak 120. Each of the images of FIGS. 13 and 14 comprises edge-like localized regions of intensity 131 and 132 corresponding to sub-diffraction orders generated by the periodic structure 32 and extending parallel to grating lines of the periodic structure 32. Each of the images further comprises edge-like localized regions of intensity 133 and 134 extending orthogonally to the grating lines of the periodic structure 32. The edge-like localized regions of intensity 133 and 134 arise due to the finite nature of the target T.

Figure 15:
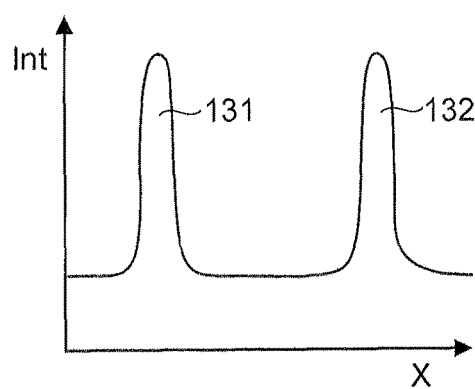
FIGS. 15 and 16 respectively depict variations of intensity with position through edge-like localized regions of intensity in the images of FIGS. 13 and 14.
Figure 16:
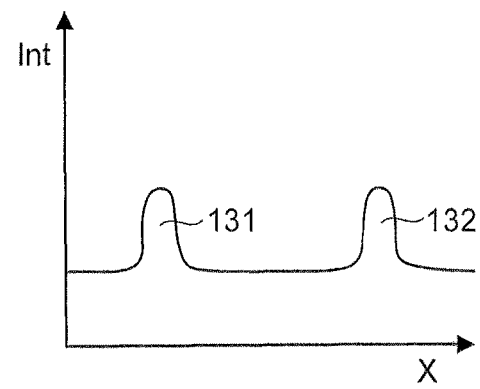

The information about the asymmetry in the target T is encoded in this case in the amplitude asymmetry of the edge-like localized regions of intensity 131 and 132. This is illustrated in FIGS. 15 and 16. FIG. 15 shows a variation of intensity, Int, with position X along the broken lines $B_{+1}$ to $B'_{+1}$ in FIG. 13. FIG. 16 shows a variation of intensity, Int, with position X along the broken lines $B_{-1}$ to $B'_{-1}$ in FIG. 14. The information about the asymmetry in the target T is encoded in the difference in the heights of the peaks 131 and 132 in FIG. 15 compared to FIG. 16. In an embodiment, the sum of peaks 131 and 132 depicted in FIG. 15 is compared with the sum of the peaks 131 and 132 depicted in FIG. 16.

Figure 17:
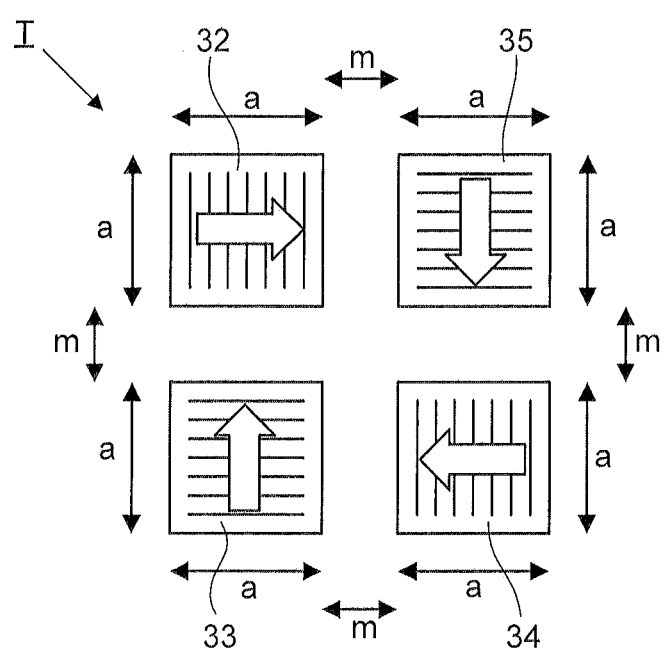
FIG. 17 depicts a target comprising four spaced apart sub-targets containing respective periodic structures.
Figure 18:
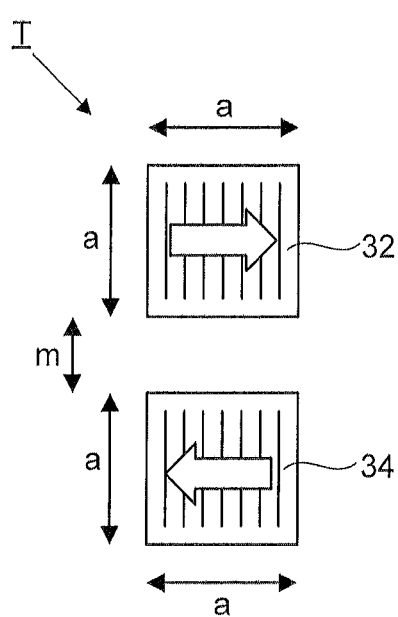
FIG. 18 depicts a target comprising two spaced apart sub-targets containing periodic structures having the same orientation and opposite bias.
Figure 19:
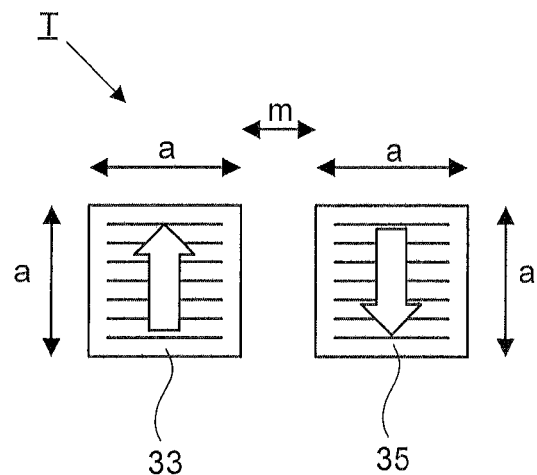
FIG. 19 depicts a target comprising two spaced apart sub-targets containing periodic structures having the same orientation as each other, but different to the orientation of the periodic structures in the target of FIG. 18, and opposite bias.

In cases such as the example above where the target T is a composite target comprising multiple sub-targets, it is desirable to arrange the sub-targets in such a way that images of the sub-targets formed from the sub-order diffraction components are spaced sufficiently far apart that the images from different sub-targets do not interfere with each other. In some embodiments, examples of which are depicted in FIGS. 17-19, each sub-target comprises a periodic structure 31-34 with a different nominal applied bias in the parameter of the patterning process (e.g. a different overlay bias +d or −d) or a different orientation (e.g. an X-direction periodic structure or a Y-direction periodic structure). In such embodiments, the sub-targets may be spaced apart from each other by at least 25%, optionally at least 50%, optionally at least 100%, of a maximum lateral dimension of each sub-target. The example of FIG. 17 depicts a target T comprising four sub-targets corresponding to periodic structures 31-34 in a similar configuration to the target T of FIG. 4 except with the individual periodic structures 31-34 spaced further apart from each other. Thus, periodic structures 32 and 34 are X-direction periodic structures with biases of +d, −d, respectively (indicated schematically by the thick arrows). Periodic structures 33 and 35 are Y-direction periodic structures with biases +d and −d respectively. Each sub-target has a square form with a side length of a. The maximum lateral dimension of each sub-target is thus a in this example. In an alternative case in which each sub-target is rectangular with side lengths a and b, the maximum lateral dimension would be the larger of a and b. The sub-targets in FIG. 17 are spaced apart by m. Thus, m should be at least 25% of a (or the larger of a and b). The overall target size may correspond to a typical target size for diffraction based overlay measurements, such as to have, for example, outer dimensions within 20 μm×20 μm or within 16 μm×16 μm (i.e. such that 2a+m=20 μm or 16 μm). FIGS. 18 and 19 show alternative targets T that each comprise sub-targets having periodic structures with the same orientation as each other but equal and opposite bias. FIG. 18 depicts X-direction periodic structures 32 and 34 with biases +d and −d. FIG. 19 depicts Y-direction periodic structures 33 and 35 with respective biases +d and −d.

Thus, in some embodiments, the detecting of the sub-order diffraction component comprises forming a first image and a second image. In an embodiment, the parameter of the patterning process is determined by comparing a first sub-order diffraction component with a second sub-order diffraction component. In some embodiments where the detecting of the sub-order diffraction component comprises forming a first image and a second image, the first sub-order diffraction component is detected by measuring a property of the first image (e.g. an average intensity or an intensity of one or more edge features) and the second sub-order diffraction component is detected by measuring a property of the second image (e.g. an average intensity or an intensity of one or more edge features). In some embodiments, the first sub-order diffraction component may be a sub-order diffraction component formed predominantly from radiation corresponding to a portion of the theoretical diffraction pattern nearer to a +1 principal first order peak than to a −1 principal first order peak (e.g. corresponding to the sub-order diffraction component 106 to the right of the principal zeroth order peak 120 in FIG. 10). The second sub-order diffraction component may be formed predominantly from radiation corresponding to a portion of the theoretical diffraction pattern nearer to the −1 principal first order peak than to the +1 principal first order peak (e.g. corresponding to the sub-order diffraction component 106 to the left of the principal zeroth order peak 120 in FIG. 10).

In a case where the patterning process comprises an error in the patterning process (e.g. non-zero overlay), the comparing of the first sub-order diffraction component with the second sub-order diffraction component may comprise determining a deviation from a nominal relationship between the first sub-order diffraction component and the second sub-order diffraction component expected when the error is zero. In an embodiment, an average intensity of an image or a selected region of an image (e.g. an edge region), formed with the first sub-order diffraction component is compared with an average intensity of an image, or a selected region of an image (e.g. an edge region), formed with the second sub-order diffraction component intensity. In an embodiment, the difference in average intensity is sensitive to the error in the patterning process and can therefore be used to provide information about the error. This approach may be used in the embodiments described above that detect sub-order diffraction components using the methodologies of FIGS. 3-5 and FIG. 6.

Figure 20:
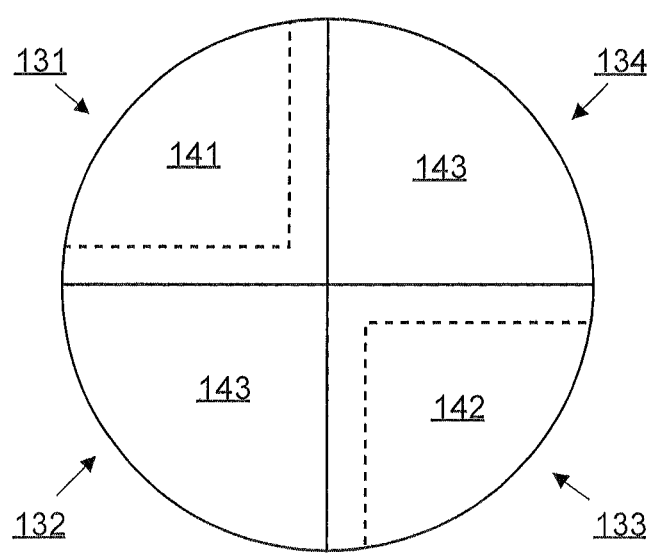
FIG. 20 depicts a pupil plane region containing point symmetric regions in which to respectively detect first and second sub-order diffraction components.

In an alternative embodiment, the detecting of the sub-order diffraction components comprises detecting an intensity or an intensity distribution in the pupil plane. In an embodiment an illumination mode is such that radiation is not incident on the target T from two diametrically opposite quadrants in the pupil plane and radiation is incident on the target T from the other two diametrically opposite quadrants in the pupil plane, as in the examples discussed above with reference to FIG. 6. As discussed above, this may lead to separation of the zeroth order radiation from the sub-order diffraction components in a pupil plane radiation distribution. FIG. 20 depicts an example pupil plane region comprising four quadrants labelled 131, 132, 133 and 134. In some embodiments of this type, the first sub-order diffraction component is detected by measuring an intensity or an intensity distribution in a first selected region 141 of the pupil plane (the region between the circular boundary and the broken line in the upper left portion of the depicted pupil plane region), and the second sub-order diffraction component is detected by measuring an intensity or an intensity distribution in a second selected region 142 of the pupil plane (the region between the circular boundary and the broken line in the lower right portion of the depicted pupil plane region). In an embodiment, an average intensity in the first selected region 141 is compared with an average intensity in the second selected region 142. In some embodiments of this type, the first selected region 141 and the second selected region 142 are point symmetric (as in FIG. 20) or mirror symmetric with respect to each other. In embodiments of this type, the underlying physics is complicated by an asymmetry contribution from the zeroth order scattered radiation caused by the reciprocity-theorem effect: if the structure is asymmetric, then the zeroth order scattered radiation in point-symmetric pixels of the pupil plane will have different intensity.

The existence of the sub-order diffraction components can also be used to extend the applicability of image-based overlay to smaller pitches. In traditional image-based overlay, an image is produced which has an asymmetry in position that is sensitive to changes in overlay in the target. By measuring the asymmetry in the image, it is possible to obtain information about asymmetry in the target T. When the main structure in the image is lost due to the principal first order peaks becoming evanescent, the existence of sub-order diffraction components will mean that information about asymmetry in the target is still present. This can be exploited to determine the parameter of the patterning process from the image. In some embodiments of this type, the detecting of the sub-order diffraction component comprises forming an image in an image plane using the sub-order diffraction component, and the parameter of the patterning process is determined by comparing a first portion of the image with a second portion of the image. In an embodiment, the comparing of the first portion of the image with a second portion of the image comprises comparing a position of a feature in the first portion of the image with a position of a feature in the second portion of the image. The features being compared may, for example, comprise spatially well-defined features formed from the sub-order diffraction components, such as spatially localized (delta like) peaks. In an embodiment, the comparison of the first portion of the image with the second portion of the image comprises obtaining a position of the center of gravity between the features. In other embodiments, a fitting routine is used to determine feature locations. By monitoring changes in the position of monitored features (e.g. the center of gravity discussed above) it is possible to obtain information about the parameter of the patterning process (e.g. overlay or focus).

In a further class of embodiments, the concept of using information from sub-order diffraction components is extended to improve measurements that benefit from accurate knowledge about the location of an image of the target. Accurate knowledge about the location of an image of the target may be beneficial for example where an intensity of the image of the target needs to be measured and the intensity is non-uniform due to the presence of interference effects (e.g. interference fringes). For example, in an embodiment of the type discussed above with reference to FIGS. 3A-5, overlay may be determined by comparing the intensities of separate images formed by +1 and −1 diffracted radiation. If fringes are present within these images the intensity in each image is non-uniform. The non-uniformity of each image complicates derivation of a single signal strength from the image, which in turns complicates or compromises derivation of overlay. Such effects are more likely to be significant when a highly coherent illumination mode is used. The influence of the effects can be reduced or removed mathematically if the location of the image of the target is known accurately.

Figure 21:
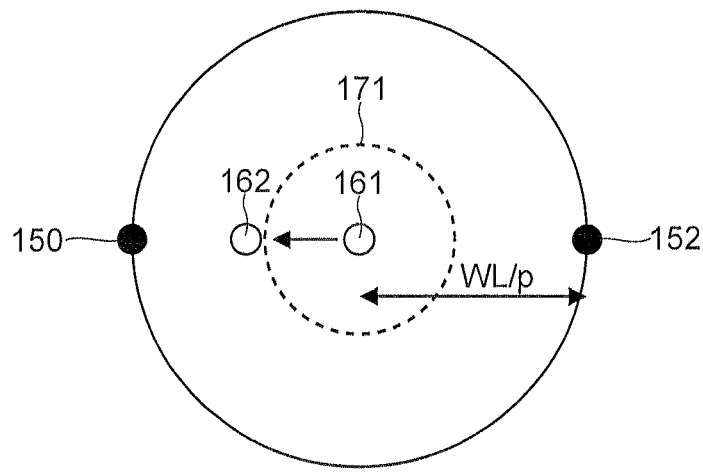
FIG. 21 depicts a theoretical pupil plane region showing scattering of principal first order radiation in a situation in which the radiation is captured and in a situation in which the radiation is not captured.

Radiation diffracted from a target contains information about various aspects of the target, including information about the target pitch and global shape (including size and location of an image of the target). Depending on various factors, such as the orientation of the illumination (illumination pupil position), the numerical aperture of the capturing optical system, the wavelength of radiation, the target pitch, and the target size, a captured image of the target may contain different combinations of information about the target. FIG. 21 schematically depicts example situations with reference to points in the theoretical pupil plane. Solid circle 150 represents where illumination radiation passes through the pupil plane (and therefore the direction of incidence of the illumination radiation onto the target). Where the illumination radiation has an angular spread, the solid circle 150 represents an axis of the illumination radiation or average k-vector. Solid circle 152 represents where the corresponding zeroth order (specular) scattered radiation passes through the pupil plane. The region 171 represents the numerical aperture of the optical system. Only scattered radiation that is within the region 171 will be captured by the optical system and contribute to the detected image of the target. The separation in the pupil plane between a center of the zeroth order radiation at circle 150 and a center of the principal first order radiation at circle 161 is determined by the ratio of wavelength (WL) to target pitch (p), WL/p. The principal first order radiation, which may for example be used to form an image from which information about overlay will be extracted, will be captured when it passes through region 171. However, if the principal first order radiation falls outside of the region 171, as indicated by open circle 162, only sub-order diffraction components will be detected. These sub-order diffraction components contain information about the location of the image of the target that will be used to obtain information about the target (e.g. formed from radiation corresponding to a principal non-zeroth order peak of radiation scattered from the target).

In an embodiment based on the above principles, a detected sub-order diffraction component is used to determine a location of an image of a target on a substrate. The determined location of the image of the target is then used to analyze the intensity of the image of the target to determine a parameter of the patterning process (e.g. overlay). In an embodiment, the image of the target is formed in such a way that the image contains significant interference fringes (e.g. because the illumination mode is highly coherent). In an embodiment, the image of the target is formed using radiation corresponding to a principal non-zeroth order peak of radiation scattered from the target (e.g. +1 or −1 diffracted radiation, as in the example of FIGS. 3A-5 discussed above), for example in a dark field mode where the principal zeroth order (specularly reflected) radiation is substantially prevented from contributing to the image. The determined location of the image of the target makes it possible to correct for these fringes during determination of the parameter of the patterning process (e.g. overlay), thereby improving reliability and/or accuracy.

In an embodiment, the illumination of the target comprises two steps. In a first step, the illumination is performed so as to avoid capture of any radiation corresponding to a principal non-zeroth order peak of radiation scattered from the target (e.g. such that radiation corresponding to at least a center of a principal first order peak in a theoretical diffraction pattern from the target falls at a position such as that of open circle 162 in FIG. 21, namely outside of the numerical aperture 171, rather than that of open circle 161 in FIG. 21). In a second step, the illumination is performed so as to allow capture of radiation corresponding to a principal non-zeroth order peak of radiation scattered from the target (e.g. such that radiation corresponding to a center of a principal first order peak in the theoretical diffraction pattern from the target falls at a position such as that of open circle 161 in FIG. 21, namely inside of the numerical aperture 171, rather than that of open circle 162 in FIG. 21). The detected sub-order diffraction component is obtained during the first step of the illumination and the image of the target used to determine the parameter of the patterning process (e.g. overlay) is obtained during the second step of the illumination. The first and second steps may be performed in sequence, with the first step being performed before the second step or with the second step being performed before the first step.

The first and second steps of the illumination may be implemented in multiple ways.

Figure 22:
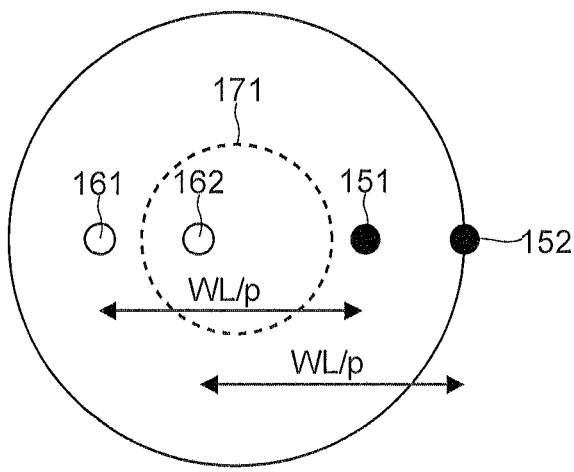
FIG. 22 depicts a theoretical pupil plane region showing how changes in the orientation of illumination radiation can control whether a principal first order component is captured or not captured.

In a first approach, as depicted schematically in FIG. 22, the avoidance of capture of any radiation corresponding to a principal non-zeroth order peak of radiation scattered from the target during the first step is at least partly achieved by using a different orientation of illumination of the target (e.g. a different angle of an axis of illumination relative to the plane of the target) during the first step relative to the second step. FIG. 22 depicts two alternative illumination orientations, respectively causing zeroth order (specular) reflection to pass through closed circles 151 and 152 in the pupil plane. When the illumination radiation is oriented so as to pass through closed circle 151, the principal first order component falls outside the numerical aperture 171 at open circle 161 and is not captured. This illumination configuration is thus suitable for performing the first step of the illumination. In contrast, when the illumination radiation is oriented so as to pass through closed circle 152, the principal first order component falls inside the numerical aperture 171 at open circle 162 and is captured. This illumination configuration is thus suitable for performing the second step of the illumination.

Figure 23:
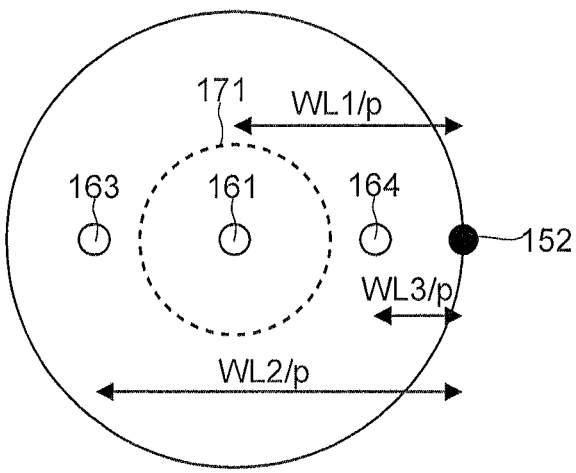
FIG. 23 depicts a theoretical pupil plane showing how changes in the wavelength of illumination radiation can control whether a principal first order component is captured or not captured.

In a second approach, as depicted schematically in FIG. 23, the avoidance of capture of any radiation corresponding to a principal non-zeroth order peak of radiation scattered from the target during the first step is at least partly achieved by illuminating with radiation having a different wavelength during the first step relative to the second step. FIG. 23 depicts examples of illumination with three different wavelengths, WL1-WL3. In each case the zeroth order (specular) reflection passes through closed circle 152 in the pupil plane, whereas the differences in wavelength cause a principal first order component in each case to pass through a different respective one of three different regions in the pupil plane, indicated by open circles 161, 163 and 164. The difference arises due to the different wavelengths causing a corresponding difference in the ratio of wavelength to pitch, as indicated by the double headed arrows. Thus, when the wavelength is WL1, a principal first order component is captured. This illumination configuration is thus suitable for performing the first step of the illumination. Provided the difference is adequately large to move the radiation outside of the numerical aperture 171, use of a longer wavelength (e.g. WL2) or a shorter wavelength (e.g. WL3) can lead to the principal first order component not being captured, as indicated by the respective open circles 163 and 164 lying outside of the numerical aperture 171. Any such illumination configuration would be suitable for performing the first step of the illumination.

Further embodiments according to the invention are further described in below numbered clauses:

1. A method of measuring a parameter of a patterning process, the method comprising:
   illuminating a target formed by the patterning process;
   detecting a sub-order diffraction component of radiation scattered from the target; and
   using the detected sub-order diffraction component to determine the parameter of the patterning process.
2. The method of clause 1, wherein the sub-order diffraction component is formed predominantly from radiation corresponding to a portion of a theoretical diffraction pattern from the target between and outside of principal first order peaks and outside of a principal zeroth order peak.
3. The method of clause 2, wherein the detecting of the sub-order diffraction component comprises separating radiation corresponding to the sub-order diffraction component from radiation corresponding to the principal zeroth order peak.
4. The method of clause 3, wherein the separation comprises directing the radiation corresponding to the principal zeroth order peak and the radiation corresponding to the sub-order diffraction component through separate respective regions in a pupil plane of an optical system between the target and a detector.
5. The method of clause 4, wherein the parameter of the patterning process is determined by comparing a first sub-order diffraction component with a second sub-order diffraction component.
6. The method of clause 5, wherein:
   the first sub-order diffraction component is formed predominantly from radiation corresponding to a portion of the theoretical diffraction pattern nearer to a +1 principal first order peak than to a −1 principal first order peak; and
   the second sub-order diffraction component is formed predominantly from radiation corresponding to a portion of the theoretical diffraction pattern nearer to the −1 principal first order peak than to the +1 principal first order peak.
7. The method of clause 5 or clause 6, wherein:
   the parameter of the patterning process comprises an error in the patterning process; and
   the comparing of the first sub-order diffraction component with the second sub-order diffraction component comprises determining a deviation from a nominal relationship between the first sub-order diffraction component and the second sub-order diffraction component expected when the error is zero, the deviation thereby providing information about the parameter of the patterning process.
8. The method of any of clauses 5-7, wherein the detecting of the sub-order diffraction component comprises detecting an intensity or an intensity distribution in the pupil plane.
9. The method of clause 8, wherein:
   the first sub-order diffraction component is detected by measuring an intensity or an intensity distribution in a first selected region of the pupil plane; and
   the second sub-order diffraction component is detected by measuring an intensity or an intensity distribution in a second selected region of the pupil plane.
10. The method of clause 9, wherein the first selected region and the second selected region are point symmetric or mirror symmetric with respect to each other.
11. The method of any of clauses 5-7, wherein the detecting of the sub-order diffraction component comprises forming an image in an image plane using the sub-order diffraction component.
12. The method of clause 11, wherein:
    the forming of an image comprises forming a first image and a second image;
    the first sub-order diffraction component is detected by measuring a property of the first image; and
    the second sub-order diffraction component is detected by measuring a property of the second image.
13. The method of clause 1, wherein:
    the detecting of the sub-order diffraction component comprises forming an image in an image plane using the sub-order diffraction component; and
    the parameter of the patterning process is determined by comparing a first portion of the image with a second portion of the image.
14. The method of clause 13, wherein the comparing of the first portion of the image with the second portion of the image comprises comparing a position of a feature in the first portion of the image with a position of a feature in the second portion of the image.
15. The method of clause 1, wherein the detected sub-order diffraction component is used to determine a location of an image of the target.
16. The method of clause 15, further comprising using the determined location of the image of the target to analyze the intensity of the image of the target to determine the parameter of the patterning process.
17. The method of clause 16, wherein the image of the target that is used to determine the parameter of the patterning process is formed using radiation corresponding to a principal non-zeroth order peak of radiation scattered from the target.
18. The method of clause 17, wherein:
    in a first step of the illumination of the target, the illumination is performed so as to avoid capture of any radiation corresponding to a principal non-zeroth order peak of radiation scattered from the target; and
    in a second step of the illumination of the target, the illumination is performed so as to allow capture of radiation corresponding to a principal non-zeroth order peak of radiation scattered from the target.
19. The method of clause 18, wherein the detected sub-order diffraction component is obtained during the first step of the illumination and the image of the target used to determine the parameter of the patterning process is obtained during the second step of the illumination.
20. The method of clause 18 or clause 19, wherein the avoidance of capture of any radiation corresponding to a principal non-zeroth order peak of radiation scattered from the target during the first step is at least partly achieved by using a different orientation of illumination of the target during the first step relative to the second step.
21. The method of any of clauses 18-20, wherein the avoidance of capture of any radiation corresponding to a principal non-zeroth order peak of radiation scattered from the target during the first step is at least partly achieved by illuminating with radiation having a different wavelength during the first step relative to the second step.
22. The method of any of clauses 1-21, wherein the target comprises a periodic structure.
23. The method of any of clauses 1-22, wherein:
   the periodic structure comprises a principal periodicity equal to a size of a repeating unit cell in a direction of periodicity of the periodic structure;
   the principal zeroth order peak and the principal first order peaks are principal peaks of the theoretical diffraction pattern corresponding to the principal periodicity;
   the principal zeroth order peak extends from a maximum of the principal zeroth order peak to minima of the principal zeroth order peak; and
   each principal first order peak extends from a maximum of the principal first order peak to minima of the principal first order peak.
24. The method of clause 22 or clause 23, wherein:
   the periodic structure comprises a diffraction grating having a finite number of grating lines such that a theoretical diffraction pattern from the grating comprises a plurality of principal peaks located at the same positions as principal peaks in a theoretical diffraction pattern from a diffraction grating with the same periodicity and an infinite number of grating lines; and
   the sub-order diffraction component of radiation is formed from radiation defined by structure in the theoretical diffraction pattern outside of the principal peaks.
25. The method of any of clauses 1-24, wherein the parameter of the patterning process comprises an error in overlay between different layers of the target or an error in focus.
26. The method of any of clauses 1-25, wherein the illumination and periodic structure are such that radiation corresponding to principal first order peaks of the theoretical diffraction pattern from the target either falls outside of a numerical aperture of an optical system between the target and a detector or is evanescent.
27. The method of any of clauses 1-26, wherein a pitch of a principal periodicity of the target is between 50 nm and 400 nm.
28. The method of any of clauses 1-27, wherein:
   the target comprises multiple sub-targets, each sub-target comprising a periodic structure with a different nominal applied bias in the parameter of the patterning process or a different orientation; and
   the sub-targets are spaced apart from each other by at least 25% of a maximum lateral dimension of each sub-target.
29. A metrology apparatus for measuring a parameter of a patterning process, the metrology apparatus comprising:
   an optical system configured to illuminate a target with radiation and direct radiation scattered from the target to a detector, wherein the optical system and detector are configured to detect a sub-order diffraction component of radiation scattered from the target.
30. A target for use in a method of determining a parameter of a patterning process, the target comprising:
   a multilayer structure having a periodic structure formed in two or more layers of the multilayer structure, wherein a wavelength of a principal periodicity of the periodic structure is between 50 nm and 400 nm.
31. The target of clause 30, wherein:
   the target comprises multiple sub-targets, each sub-target comprising a periodic structure with a different nominal applied bias in the parameter of the patterning process or a different orientation; and
   the sub-targets are spaced apart from each other by at least 25% of a maximum lateral dimension of each sub-target.

Although specific reference may be made in this text to the use of a metrology apparatus in the manufacture of ICs, it should be understood that the metrology apparatus and processes described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or one or more various other tools. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

According to an embodiment, all or portions of one or more methods described herein may be performed by a computer system in response to one or more processors executing one or more sequences of one or more instructions contained in a computer-readable medium, such as a memory. Such instructions may be read into a memory from another computer-readable medium, such as a storage device. Execution of the sequences of instructions causes one or more processors to perform one or more process steps described herein. One or more processors in a multi-processing arrangement may also be employed to execute the sequences of instructions. In an embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to one or more processors for execution. Such a medium may take many forms, including but not limited to, non-volatile media, volatile media, and transmission media. Non-volatile media include, for example, optical or magnetic disks. Volatile media include memory or other storage media. Transmission media include coaxial cables, copper wire and fiber optics. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions therein (e.g., recorded thereon). The instructions, when executed by a computer system, can implement any of the features described herein. Transitory computer-readable media can include a carrier wave or other propagating electromagnetic signal.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

The invention claimed is:

1. A method of measuring a parameter of a patterning process, the method comprising:
   illuminating a target formed by the patterning process;
   detecting a sub-order diffraction component of radiation scattered from the target; and
   using the detected sub-order diffraction component to determine a value of the parameter of the patterning process.

2. The method of claim 1, wherein the sub-order diffraction component is formed predominantly from radiation corresponding to a portion of a theoretical diffraction pattern from the target between and outside of principal first order peaks and outside of a principal zeroth order peak.

3. The method of claim 2, wherein the detecting of the sub-order diffraction component comprises separating radiation corresponding to the sub-order diffraction component from radiation corresponding to the principal zeroth order peak.

4. The method of claim 3, wherein the separation comprises directing the radiation corresponding to the principal zeroth order peak and the radiation corresponding to the sub-order diffraction component through separate respective regions in a pupil plane of an optical system between the target and a detector.

5. The method of claim 4, wherein the parameter of the patterning process is determined by comparing a first sub-order diffraction component with a second sub-order diffraction component.

6. The method of claim 5, wherein:
   the first sub-order diffraction component is formed predominantly from radiation corresponding to a portion of the theoretical diffraction pattern nearer to a+1 principal first order peak than to a−1 principal first order peak; and
   the second sub-order diffraction component is formed predominantly from radiation corresponding to a portion of the theoretical diffraction pattern nearer to the −1 principal first order peak than to the +1 principal first order peak.

7. The method of claim 5, wherein:
   the parameter of the patterning process comprises an error in the patterning process; and
   the comparing of the first sub-order diffraction component with the second sub-order diffraction component comprises determining a deviation from a nominal relationship between the first sub-order diffraction component and the second sub-order diffraction component expected when the error is zero, the deviation thereby providing information about the parameter of the patterning process.

8. The method of claim 5, wherein the detecting of the sub-order diffraction component comprises detecting an intensity or an intensity distribution in the pupil plane.

9. The method of claim 8, wherein:
   the first sub-order diffraction component is detected by measuring an intensity or an intensity distribution in a first selected region of the pupil plane; and
   the second sub-order diffraction component is detected by measuring an intensity or an intensity distribution in a second selected region of the pupil plane.

10. The method of claim 9, wherein the first selected region and the second selected region are point symmetric or mirror symmetric with respect to each other.

11. The method of claim 5, wherein the detecting of the sub-order diffraction component comprises forming an image in an image plane using the sub-order diffraction component.

12. The method of claim 11, wherein:
   the forming of an image comprises forming a first image and a second image;
   the first sub-order diffraction component is detected by measuring a property of the first image; and
   the second sub-order diffraction component is detected by measuring a property of the second image.

13. The method of claim 1, wherein:
   the detecting of the sub-order diffraction component comprises forming an image in an image plane using the sub-order diffraction component; and
   the parameter of the patterning process is determined by comparing a first portion of the image with a second portion of the image.

14. The method of claim 1, wherein the detected sub-order diffraction component is used to determine a location of an image of the target.

15. The method of claim 14, further comprising using the determined location of the image of the target to analyze the intensity of the image of the target to determine the parameter of the patterning process.

16. The method of claim 1, wherein:
the periodic structure comprises a principal periodicity equal to a size of a repeating unit cell in a direction of periodicity of the periodic structure;
the principal zeroth order peak and the principal first order peaks are principal peaks of the theoretical diffraction pattern corresponding to the principal periodicity;
the principal zeroth order peak extends from a maximum of the principal zeroth order peak to minima of the principal zeroth order peak; and
each principal first order peak extends from a maximum of the principal first order peak to minima of the principal first order peak.

17. The method of claim 1, wherein the illumination and periodic structure are such that radiation corresponding to principal first order peaks of the theoretical diffraction pattern from the target either falls outside of a numerical aperture of an optical system between the target and a detector or is evanescent.

18. The method of claim 1, wherein:
the target comprises multiple sub-targets, each sub-target comprising a periodic structure with a different nominal applied bias in the parameter of the patterning process or a different orientation; and
the sub-targets are spaced apart from each other by at least 25% of a maximum lateral dimension of each sub-target.

19. A method of measuring a parameter of a patterning process, the method comprising:
illuminating a target formed by the patterning process;
detecting a sub-order diffraction component of radiation scattered from the target; and
using the detected sub-order diffraction component to determine the parameter of the patterning process, the using the detected sub-order diffraction component comparing a first sub-order diffraction component with a second sub-order diffraction component.

20. The method of claim 19, wherein the comparing comprises determining a deviation from a nominal relationship between the first sub-order diffraction component and the second sub-order diffraction component expected when the error is zero, the deviation providing information about the parameter of the patterning process.

21. A method of measuring a parameter of a patterning process, the method comprising:
illuminating a target formed by the patterning process;
detecting a sub-order diffraction component of radiation scattered from the target, the detecting comprising separating radiation corresponding to the sub-order diffraction component in the scattered radiation from radiation corresponding to a principal zeroth order peak in the scattered radiation; and
using the detected sub-order diffraction component to determine the parameter of the patterning process.

* * * * *

UNITED STATES PATENT AND TRADEMARK OFFICE
CERTIFICATE OF CORRECTION

PATENT NO. : 11,150,563 B2
APPLICATION NO. : 16/708509
DATED : December 10, 2019
INVENTOR(S) : Sergei Sokolov et al.

Page 1 of 1

It is certified that error appears in the above-identified patent and that said Letters Patent is hereby corrected as shown below:

On the Title Page

Item (56) References Cited:
Please correct "WO2004061371, 02/2004" to "JP2004061371, 02/2004" in Foreign Patent Documents Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*